United States Patent [19]

Natarajan et al.

[11] Patent Number: 5,483,099

[45] Date of Patent: Jan. 9, 1996

[54] STANDARDIZED POWER AND GROUND DESIGN FOR PIN GRID ARRAY PACKAGES

[75] Inventors: Siva Natarajan, Gilbert; Udy Shrivastava, Tempe; William M. Siu, Paradise Valley; Mark J. Palmer, Phoenix, all of Ariz.

[73] Assignee: Intel Corporation, Santa Clara, Calif.

[21] Appl. No.: 298,925

[22] Filed: Aug. 31, 1994

[51] Int. Cl.⁶ .......................... H01L 23/52; H01L 23/48; H01L 23/02
[52] U.S. Cl. .......................... 257/691; 257/693; 257/678
[58] Field of Search .................... 257/684, 692, 257/693, 697, 698, 704, 726, 727, 691, 694, 695, 696, 924, 532, 688, 916, 904, 680, 679, 685, 686

[56] References Cited

U.S. PATENT DOCUMENTS

| | | | |
|---|---|---|---|
| 4,381,458 | 4/1983 | Anstey et al. | 257/678 |
| 4,631,572 | 12/1986 | Zimmerman | 257/691 |
| 4,954,877 | 9/1990 | Nakanishi et al. | 257/698 |
| 4,972,253 | 11/1990 | Palino et al. | 257/691 |
| 5,309,024 | 5/1994 | Hirano | 257/691 |

FOREIGN PATENT DOCUMENTS

| | | | |
|---|---|---|---|
| 2186670 | 7/1990 | Japan | 257/691 |
| 3071664 | 3/1991 | Japan | 257/691 |

Primary Examiner—Sara W. Crane
Assistant Examiner—Jhihan Clark
Attorney, Agent, or Firm—Blakely, Sokoloff, Taylor & Zafman

[57] ABSTRACT

An integrated circuit package that is coupled to a printed circuit board by a socket assembly. The socket assembly has a plurality of pins that are mounted to the circuit board. The pins are coupled to corresponding conductive sockets and outer rings of the socket assembly. The package contains an integrated circuit that is coupled to external pins which extend from a bottom surface of the package housing. The package also has a plurality of conductive rings that are located on the bottom surface of the housing and are electrically coupled to the integrated circuit. To install the package, the package pins are inserted into the individual sockets of the socket assembly. Insertion of the pins also presses the conductive rings of the package onto the corresponding outer rings of the socket. The conductive rings are typically dedicated to the power and ground pins of the system, wherein the integrated circuit receives power through the rings. The use of rings reduces the insertion force required to attach the package to the socket.

18 Claims, 4 Drawing Sheets

STANDARDIZED POWER AND GROUND DESIGN FOR PIN GRID ARRAY PACKAGES

BACKGROUND OF THE INVENTION

1. Field of The Invention

The present invention relates to an integrated circuit package.

2. Description of Related Art

Integrated circuits (ICs) are typically housed within a protective plastic or ceramic package. The package may have pins or outer surface pads that are coupled to corresponding features of a printed circuit board. The pins carry power and digital signals between the circuit board and the integrated circuit located within the package. The package will typically have a plurality of pins dedicated to digital signals, and a separate set of pins dedicated to power and ground. The number of power and ground pins are defined by the amount of power delivered to the integrated circuit. Generally speaking, more pins are required to provide an additional amount of power to the IC. Adding pins increases the size of both the package and the overall printed circuit board assembly.

Some printed circuit board assemblies utilize a socket assembly which is mounted to the printed circuit board. The socket assembly contains a plurality of individual conductive sockets that can receive the pins of an integrated circuit package and couple the package to the printed circuit board. The socket assembly allows an end user to readily attach and decouple an IC package from a printed circuit board. IC packages that contain large integrated circuits such as a microprocessor typically have a relatively large number of pins to satisfy the power and I/O (digital input/output) requirements of the IC. Each pin has an associated insertion force that is required to attach the package to the socket. An IC package with a large number of pins therefore requires a relatively large insertion force to plug the package into the socket. It would be desirable to provide an integrated circuit package that requires a lower insertion force than packages in the prior art. It would also be desirable to provide a packaging concept that allows an integrated circuit to draw more power without requiring more pins for the package.

SUMMARY OF THE INVENTION

The present invention is an integrated circuit package that is coupled to a printed circuit board by a socket assembly. The socket assembly has a plurality of pins that are mounted to the circuit board. The pins are coupled to corresponding conductive sockets and outer rings of the socket assembly. The package contains an integrated circuit that is coupled to external pins which extend from a bottom surface of the package housing. The package also has a plurality of conductive rings that are located on the bottom surface of the housing and are electrically coupled to the integrated circuit. To install the package, the package pins are inserted into the individual sockets of the socket assembly. Insertion of the pins also presses the conductive rings of the package onto the corresponding outer rings of the socket. The conductive rings are typically dedicated to the power and ground pins of the system, wherein the integrated circuit receives power through the rings. The use of rings reduces the insertion force required to attach the package to the socket.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
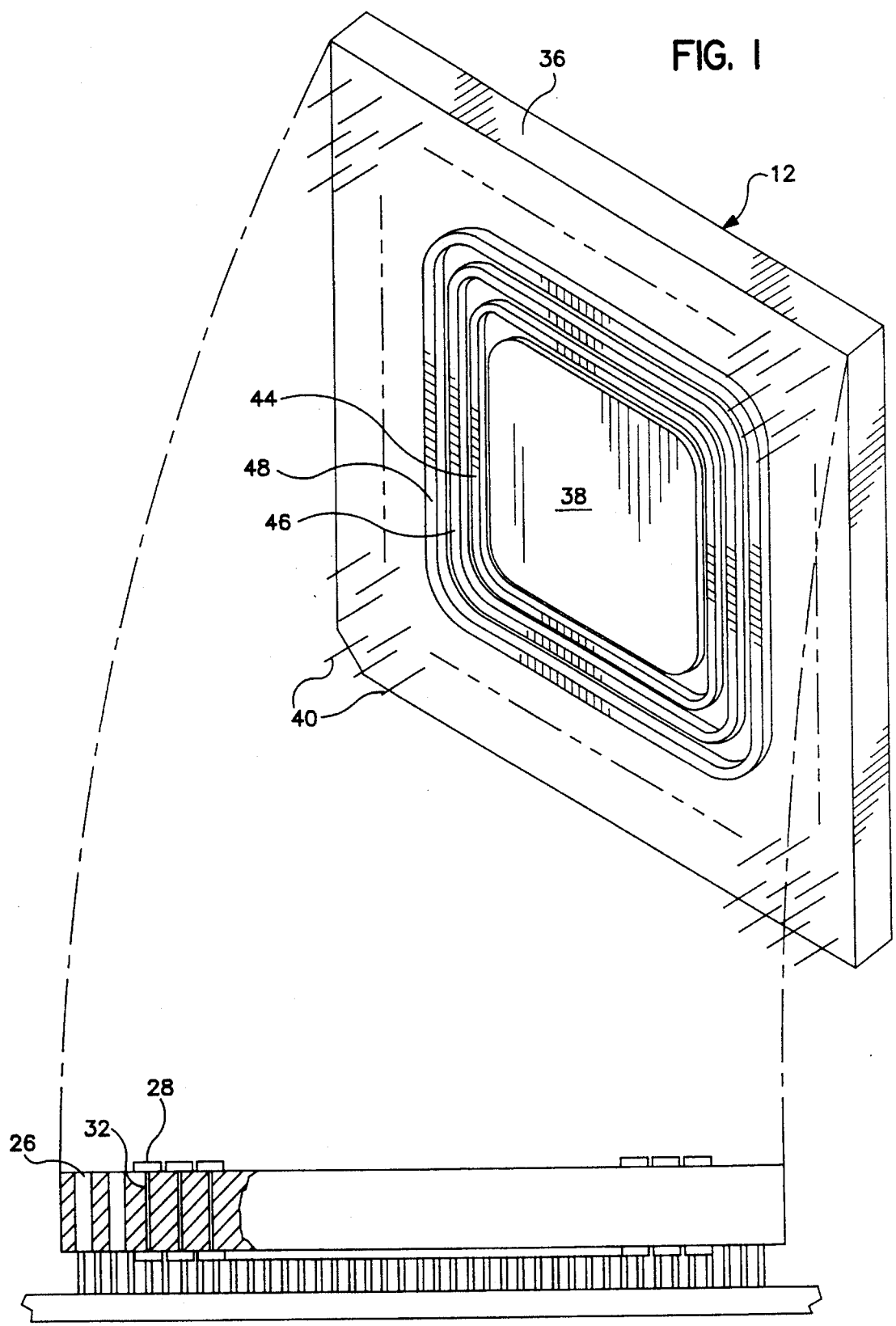
FIG. 1 is an exploded view of an integrated circuit package assembly of the present invention.

Referring to the drawings more particularly by reference numbers, FIGS. 1–4 show an integrated circuit package assembly 10 of the present invention. The assembly 10 includes an integrated circuit package 12 that is coupled to a printed circuit board 14 by a socket assembly 16. The printed circuit board 14 has a plurality of electrically conductive surface pads 18 or plated through holes that are connected to routing lines (not shown) as is known in the art. Each surface pad 18 is dedicated to either a digital signal, power or ground.

The socket assembly 16 has a plurality of electrically conductive pins 20 that are mounted to the surface pads 18 of the printed circuit board 14. The external pins 20 extend from the bottom surface 22 of a socket housing 24. The pins 20 are coupled to a plurality of individual conductive sockets 26 that extend through the housing 24. The socket assembly 16 also has a plurality of upper conductive rings 28 located on a top surface 30 of the socket housing 24. The upper rings 28 are coupled to the pins 20 by conductive vias 32 that extend through the housing 24. The socket housing 24 is typically constructed from a molded plastic dielectric material. As an alternate embodiment, the pins 20 may be replaced with solder landings.

The integrated circuit package 12 has an integrated circuit 34 located within a package housing 36. The integrated circuit 34 may be any electronic device including a microprocessor. The package housing 36 may be constructed from plastic, ceramic or any other dielectric material. The package 12 may have a lid 38 that encloses the integrated circuit 34 within an inner cavity of the housing 36.

The integrated circuit package 12 may have a plurality of external conductive pins 40 arranged in a pattern about a bottom surface 42 of the housing 36. The pins 40 are electrically coupled to the integrated circuit 34 typically by internal routing lines (not shown) and wire bonds within the housing 36. The pins 40 are dedicated to carrying digital signals. The package 12 is mounted to the socket 16 by inserting the pins 40 into the sockets 26. The sockets 26 and pins 20 electrically couple the package pins 40 to the printed circuit board 14.

Figure 2:
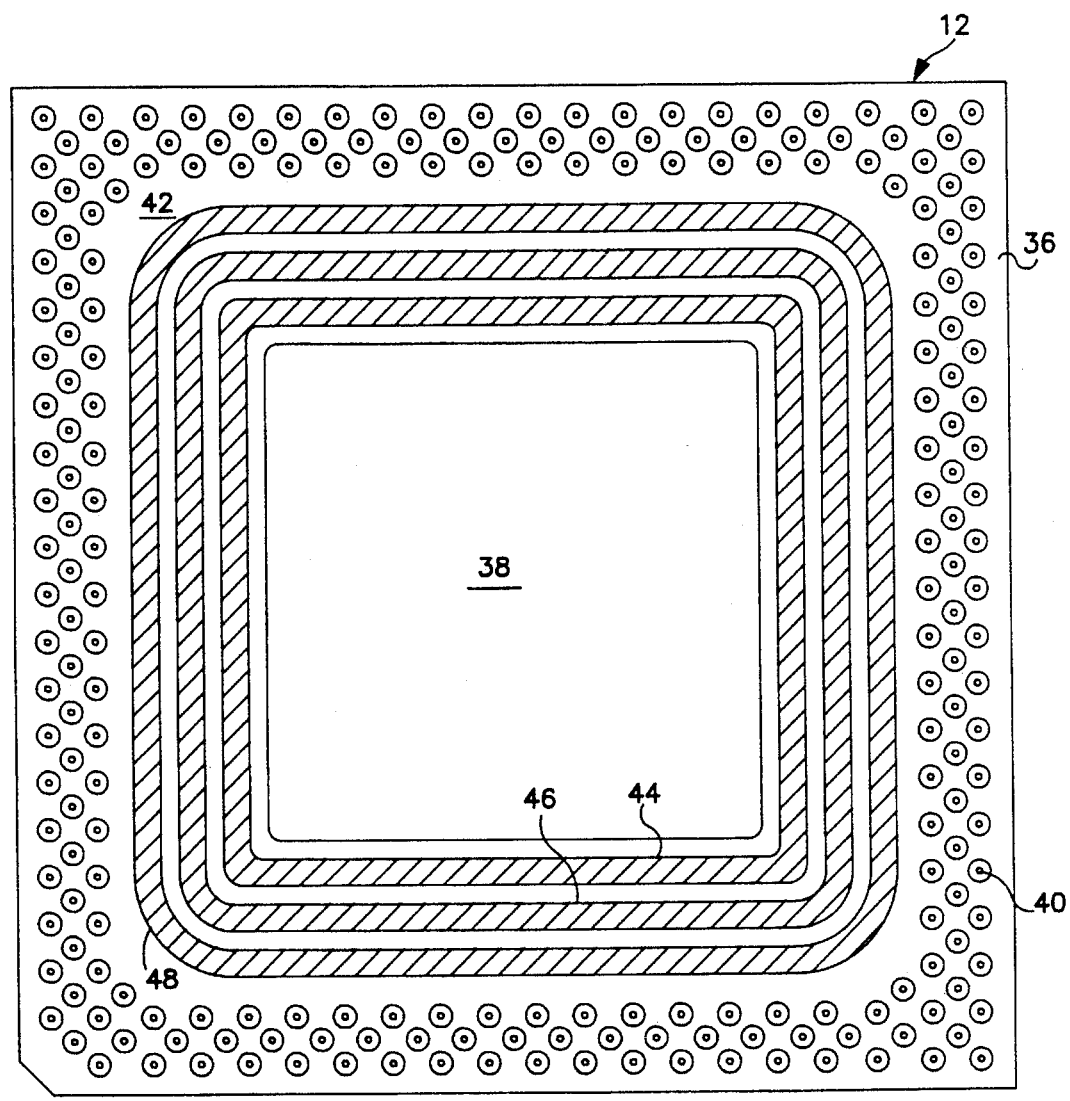
FIG. 2 is a bottom view of an integrated circuit package.

As shown in FIG. 2, the package 12 contains a plurality of conductive rings 44–48 located on the bottom surface 42 of the housing 36. The conductive rings 44–48 are electrically coupled to the integrated circuit 34 by internal routing within the housing 36. The conductive rings 44–48 are coupled to the power and ground pads of the integrated circuit 34. In the preferred embodiment, the center ring 46 is dedicated to ground and the outer rings 44 and 48 are dedicated to power. The dual power rings 44 and 48 allow the package 12 to receive two levels of power. For example, the package may receive 3.3 V power through ring 44 and 2.5 V power through ring 48. The rings 44,46,48 are preferably arranged in a concentric pattern that corresponds to the pattern of the top rings 28 of the socket assembly 16. When the package pins 40 are inserted into the sockets 26, the package rings 44–48 are pressed into operative contact with the socket rings 28, wherein the package rings 44–48 are electrically coupled to the printed circuit board 14 through the socket assembly 16.

Figure 3:
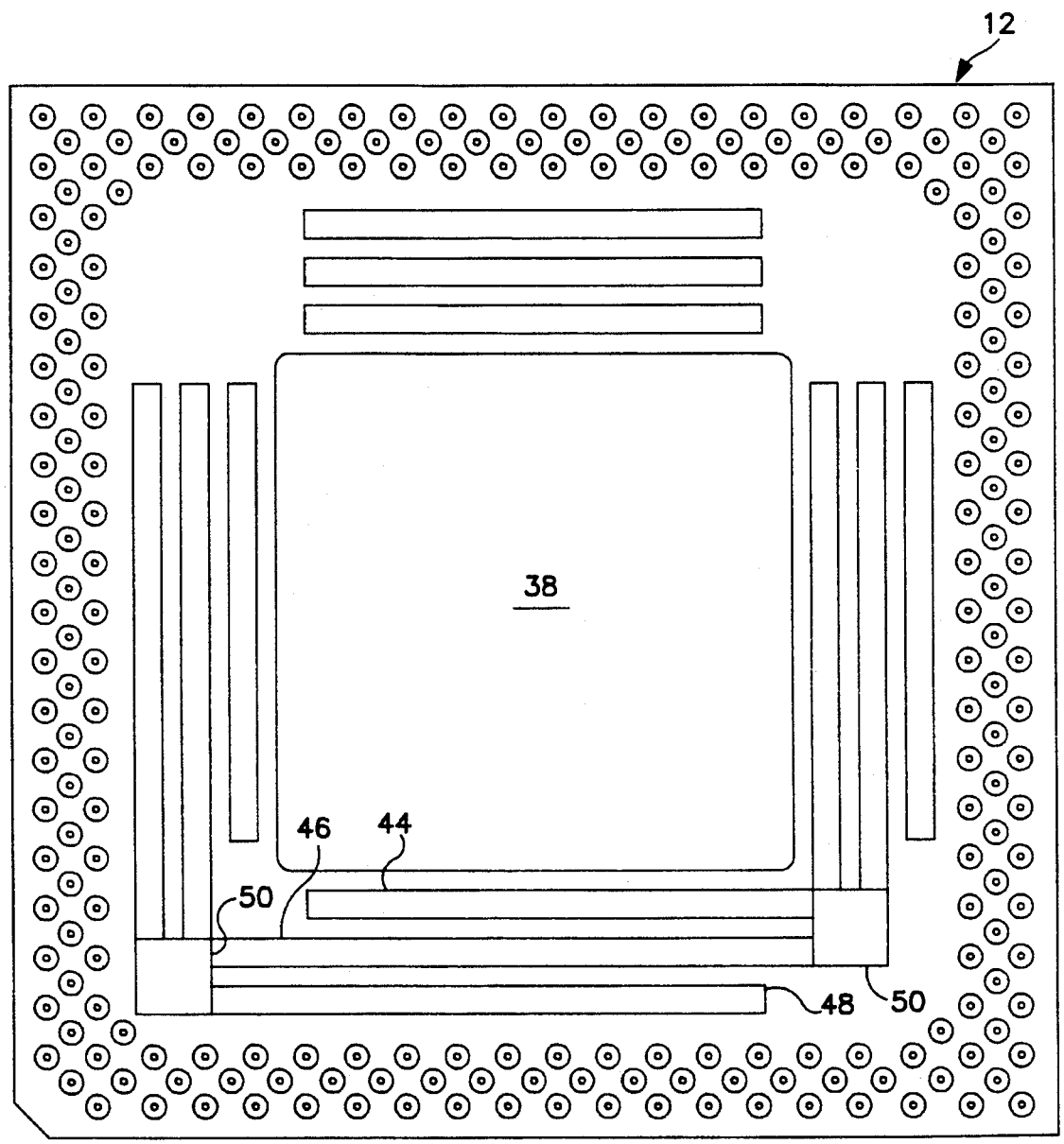
FIG. 3 is a bottom view of an alternate embodiment of the integrated circuit package.

As shown in FIG. 3, a passive device 50 can be attached to the conductive rings 44–48 of package 12. The passive device 50 may be a capacitor(s) that lowers the amount of electrical noise in the power provided to the integrated circuit 34. Additionally, the lid 38 can be used as a power/ground plane that is coupled to a corresponding plane of the socket assembly 16.

Figure 4:
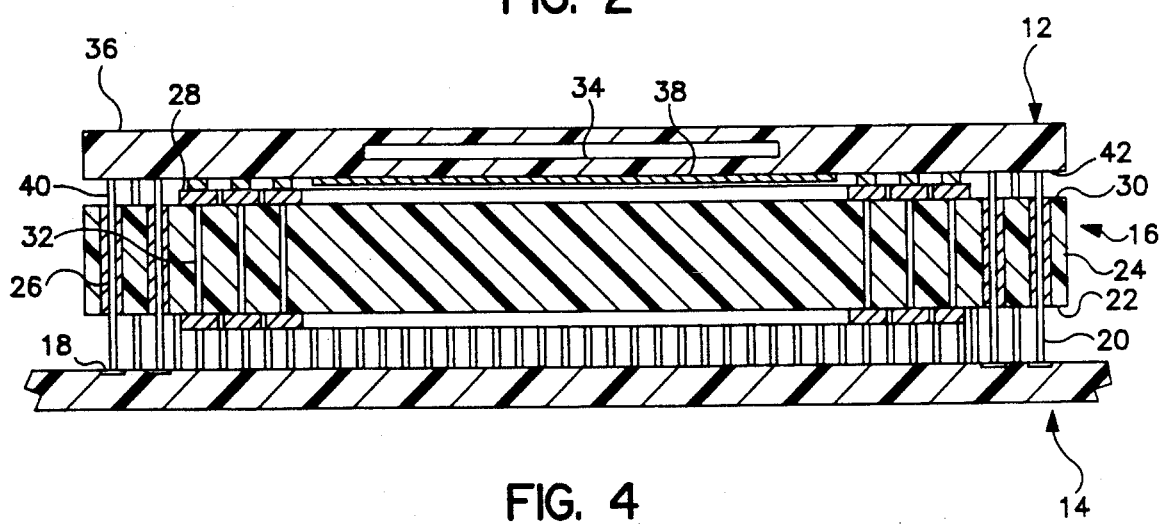
FIG. 4 is a cross-sectional view of the integrated circuit coupled to a printed circuit board by a socket assembly.

As shown in FIG. 4, the integrated circuit package assembly 10 is assembled by initially mounting the socket assembly 16 to the printed circuit board 14. The package 12 is mounted to the socket assembly 16 by pressing the pins 40 into the sockets 26 and pressing the package rings 44–48 against the upper rings 28 of the socket assembly 16. The socket assembly 16 electrically couples the package 12 and integrated circuit 34 to the printed circuit board 14. The pins 20 and 40 carry digital signals. The rings 28 and 44–48 provide power and ground to the integrated circuit 38.

Utilizing rings 28 and 44–48 lowers the insertion force required to attach the integrated circuit package 12 to the socket assembly 16. The rings also provide a relatively low impedance for power and ground, wherein the integrated circuit 34 can draw a relatively large amount of power without having to provide additional pins on the package. Additionally, the ring shape of the power and ground leads of the package 12 and socket assembly 16 reduce the amount of inductance between the pins 40 and the rings.

Figure 5:
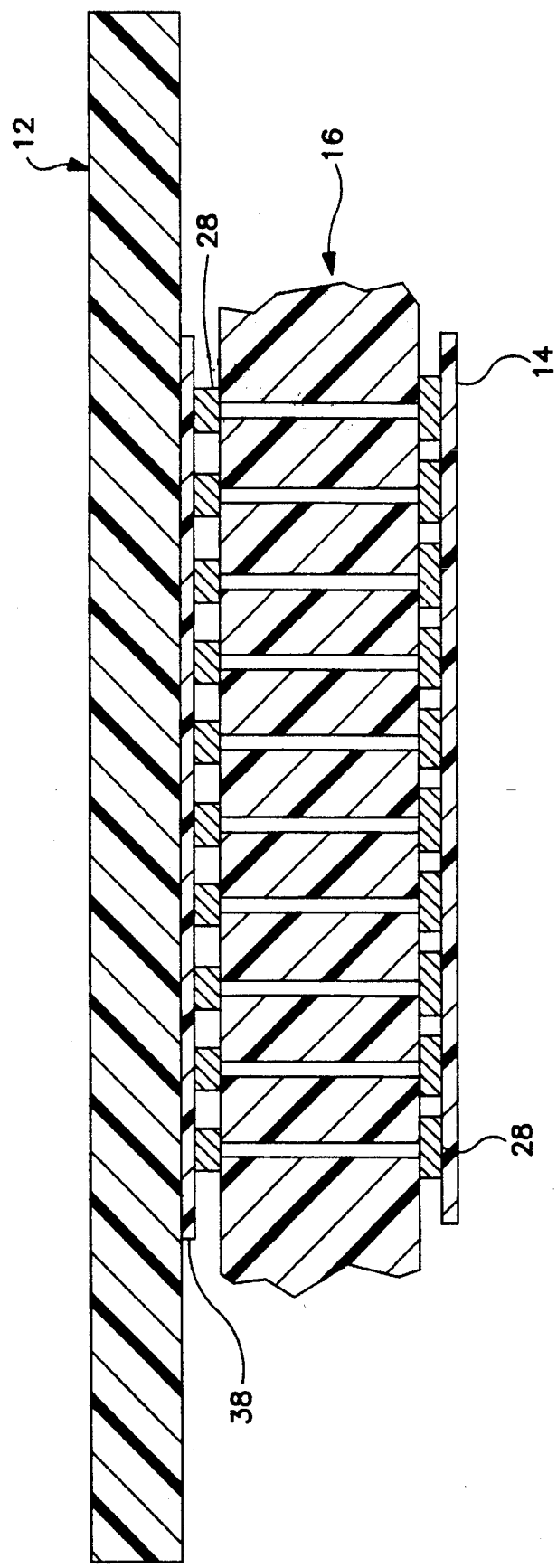
FIG. 5 is a cross-sectional view of an alternate embodiment wherein the socket is surface mounted to the printed circuit board.

FIG. 5 shows an alternate embodiment of a socket 16 that is surface mounted to the printed circuit board 14 by rings 28 instead of pins 20.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package that can be mounted to an external device, comprising:

an integrated circuit;

a housing that encapsulates said integrated circuit, said housing having a bottom outer surface;

a plurality of pins that extend from said bottom outer surface of said housing and are electrically coupled to said integrated circuit; and, a conductive ring electrically coupled to said integrated circuit and located at said bottom outer surface of said housing so that said package is electrically coupled to the external device through said pins and by pressing said conductive ring onto the external device.

2. The package as recited in claim 1, wherein there are three concentric conductive rings located at said bottom surface of said housing.

3. The package as recited in claim 1, further comprising a passive device attached to said conductive ring.

4. The package as recited in claim 1, wherein said conductive ring is concentrically located about a lid of said housing.

5. The package as recited in claim 2, wherein said conductive rings are dedicated to electrical power and ground.

6. The package as recited in claim 3 wherein said passive device is a capacitor.

7. The package as recited in claim 4 wherein said lid is electrically coupled to said integrated circuit.

8. An electronic package assembly, comprising:

a circuit housing that has a bottom surface;

an integrated circuit located within said circuit housing;

a plurality of first pins that extend from said bottom surface of said circuit housing and are electrically coupled to said integrated circuit;

a package conductive ring located at said bottom surface of said circuit housing and electrically coupled to said integrated circuit;

a socket housing;

a plurality of second pins that extend from said socket housing and are coupled to said first pins and said package conductive ring; and, a socket conductive ring that is coupled to said second Dins and said package conductive ring.

9. The assembly as recited in claim 8, wherein there are three concentric package conductive rings located at said bottom surface of said circuit housing.

10. The assembly as recited in claim 8, wherein said socket housing has a plurality of sockets that receive said first pins and couple said first pins to said second pins.

11. The assembly as recited in claim 8, further comprising a passive device attached to said package conductive ring.

12. The assembly as recited in claim 8, wherein said conductive ring is concentrically located about a lid of said housing, wherein said lid is electrically coupled to said integrated circuit.

13. The assembly as recited in claim 8, further comprising a printed circuit board attached to said second pins.

14. The assembly as recited in claim 9, wherein said conductive rings are dedicated to electrical power and ground.

15. The assembly as recited in claim 14, wherein said socket housing has vias that couple said socket conductive ring to said second pins.

16. The assembly as recited in claim 11, wherein said passive device is a capacitor.

17. A socket assembly that couples an electronic package to a printed circuit board, wherein the electronic package has a conductive ring and a plurality of pins, comprising:

a socket housing that has a top surface and an opposite bottom surface;

a plurality of pins that extend from said bottom surface of said socket housing;

a plurality of sockets that extend through said socket housing and are coupled to said pins, said sockets receive the pins of the electronic package; and, a conductive ring that is located on said top surface of said socket housing and is coupled to said pins, wherein the electronic package conductive ring is pressed into contact with said socket housing conductive ring when said sockets receive the pins of the electronic package.

18. The socket as recited in claim 17, wherein said conductive ring is coupled to said pins by a via.

* * * * *

UNITED STATES PATENT AND TRADEMARK OFFICE
CERTIFICATE OF CORRECTION

PATENT NO.    : 5,483,099
DATED         : January 9, 1996
INVENTOR(S)   : Natarajan et al.

It is certified that error appears in the above-identified patent and that said Letters Patent is hereby corrected as shown below:

In column 4 at line 24 delete "Dins" and insert --pins--

Signed and Sealed this

Seventh Day of January, 1997

Attest:

BRUCE LEHMAN

Attesting Officer          Commissioner of Patents and Trademarks